(12) United States Patent
Ester

(10) Patent No.: US 10,856,365 B2
(45) Date of Patent: Dec. 1, 2020

(54) SELF REGULATING FLEXIBLE HEATING DEVICE

(71) Applicant: Mark Allen Ester, Stillwater, MN (US)

(72) Inventor: Mark Allen Ester, Stillwater, MN (US)

( * ) Notice: Subject to any disclaimer, the term of this patent is extended or adjusted under 35 U.S.C. 154(b) by 0 days.

(21) Appl. No.: 16/684,344

(22) Filed: Nov. 14, 2019

(65) Prior Publication Data

US 2020/0154526 A1 May 14, 2020

Related U.S. Application Data

(60) Provisional application No. 62/766,969, filed on Nov. 14, 2018.

(51) Int. Cl.
| | |
|---|---|
| *H05B 3/36* | (2006.01) |
| *H05K 3/12* | (2006.01) |
| *H05K 3/40* | (2006.01) |
| *H05K 1/16* | (2006.01) |
| *H05K 1/02* | (2006.01) |

(52) U.S. Cl.
CPC ............ *H05B 3/36* (2013.01); *H05K 1/0212* (2013.01); *H05K 1/167* (2013.01); *H05K 3/125* (2013.01); *H05K 3/4069* (2013.01); *H05B 2203/017* (2013.01); *H05B 2203/02* (2013.01); *H05K 2201/10272* (2013.01)

(58) Field of Classification Search
CPC .... H05B 3/36; H05B 2203/02; H05K 1/0212; H05K 1/167; H05K 3/125; H05K 3/4069

USPC ......................................................... 174/257
See application file for complete search history.

(56) References Cited

U.S. PATENT DOCUMENTS

| | | |
|---|---|---|
| 4,747,211 A | 5/1988 | Gilleo et al. |
| 5,003,693 A | 4/1991 | Atkinson et al. |
| 2015/0261057 A1* | 9/2015 | Harris ..................... G02F 1/163 |
| | | 359/271 |

* cited by examiner

*Primary Examiner* — Tremesha S Willis
(74) *Attorney, Agent, or Firm* — Schwegman Lundberg & Woessner, P.A.

(57) ABSTRACT

An improved resistive heating device includes multiple printed heating elements joined through a flexible film substrate to bus bars printed on an opposite side of the flexible film. The heating elements may be printed using a positive temperature coefficient ink to provide a self-regulated maximum temperature based on a given input voltage. This printing of electrical components on both sides of a flexible film, referred to herein as double-sided polymer circuitry (D/SPC®), provides various additional advantages over single-sided printing, such as an increased heat per unit surface area. This also provides a more concentrated and evenly distributed heat pattern, and will reduce or eliminate the exhibition of hot spots or varying patterns of heat throughout the heating element. This printing on both sides of the flexible film results in an improved, fault-tolerant bus bar topology, which may be used in fault-critical medical applications or other mission-critical applications.

20 Claims, 4 Drawing Sheets

SELF REGULATING FLEXIBLE HEATING DEVICE

RELATED APPLICATION AND PRIORITY CLAIM

This application is related and claims priority to U.S. Provisional Application No. 62/766,969, filed on Nov. 14, 2018 and entitled "Method of joining a top side printed positive temperature coefficient ink with bus bars on the back side of polyester, polyetherimide, or polyimide films with vias," the entirety of which is incorporated herein by reference.

TECHNICAL FIELD

Embodiments described herein generally relate to resistive heating devices.

BACKGROUND

Resistive heating devices may include a power source connected to a resistive heating element, where the resistive heating element generates heat in response to applied power. However, existing solutions for resistive heating devices include one or more control electronics to control the heat generated by the resistive heating device. These control electronics often include an integrated circuit (IC) on a rigid printed circuit board (PCB), where the resistive heating element is mounted on or connected to the rigid PCB. These control electronics may increase the complexity and cost of existing resistive heating devices. It is desirable to provide an improved resistive heating device.

DESCRIPTION OF EMBODIMENTS

An improved resistive heating device includes multiple printed heating elements joined through a flexible film substrate to bus bars printed on an opposite side of the flexible film (e.g., polymer). The heating elements may be printed using a positive temperature coefficient (PTC) ink, which may provide a self-regulated maximum temperature based on a given input voltage. In order for the bus bars to carry sufficient current to the heating elements, the bus bars may require a surface area comparable to the surface area of the heating elements. This improved resistive heating device provides advantages over single-sided applications, which would otherwise dedicate approximately half of the surface to bus bars. By printing the bus bars on the opposite side of the flexible film substrate, the heating elements may cover most or all of the heating surface to deliver heat, thereby providing more heating element area on the heating side of the flexible film substrate.

This printing of electrical components on both sides of a flexible film, referred to herein as double-sided polymer circuitry (D/SPC®), provides various additional advantages over single-sided printing. In an example, the printing of heating elements and bus bars on opposite sides of the flexible film uses less space (e.g., improves volumetric efficiency), which increases the heat per square inch (heating efficiency). This also provides a more concentrated and evenly distributed heat pattern, and will reduce or eliminate the exhibition of hot spots or varying patterns of heat throughout the heating element. The use of printed heating elements and printed bus bars provides additional advantages over copper circuit heaters, including significant reductions in conductive material costs, reductions in device weight, and elimination of waste generated by etching copper circuitry.

Additionally, the flexibility and reliability of the resulting device provides various advantages over rigid PCBs, including conforming the flexible printed heating device into 3-D shapes such as handle grips, pipes, contoured body features, and other structures. This printing on both sides of the flexible film results in an improved, fault-tolerant bus bar topology, which may be used in fault-critical medical applications or other mission-critical applications. Additional advantages provided by this improved resistive heating device are described herein.

The following description and the drawings sufficiently illustrate specific embodiments to enable those skilled in the art to practice them. Other embodiments may incorporate structural, logical, electrical, process, and other changes. Portions and features of various embodiments may be included in, or substituted for, those of other embodiments. Embodiments set forth in the claims encompass all available equivalents of those claims.

Figure 1:
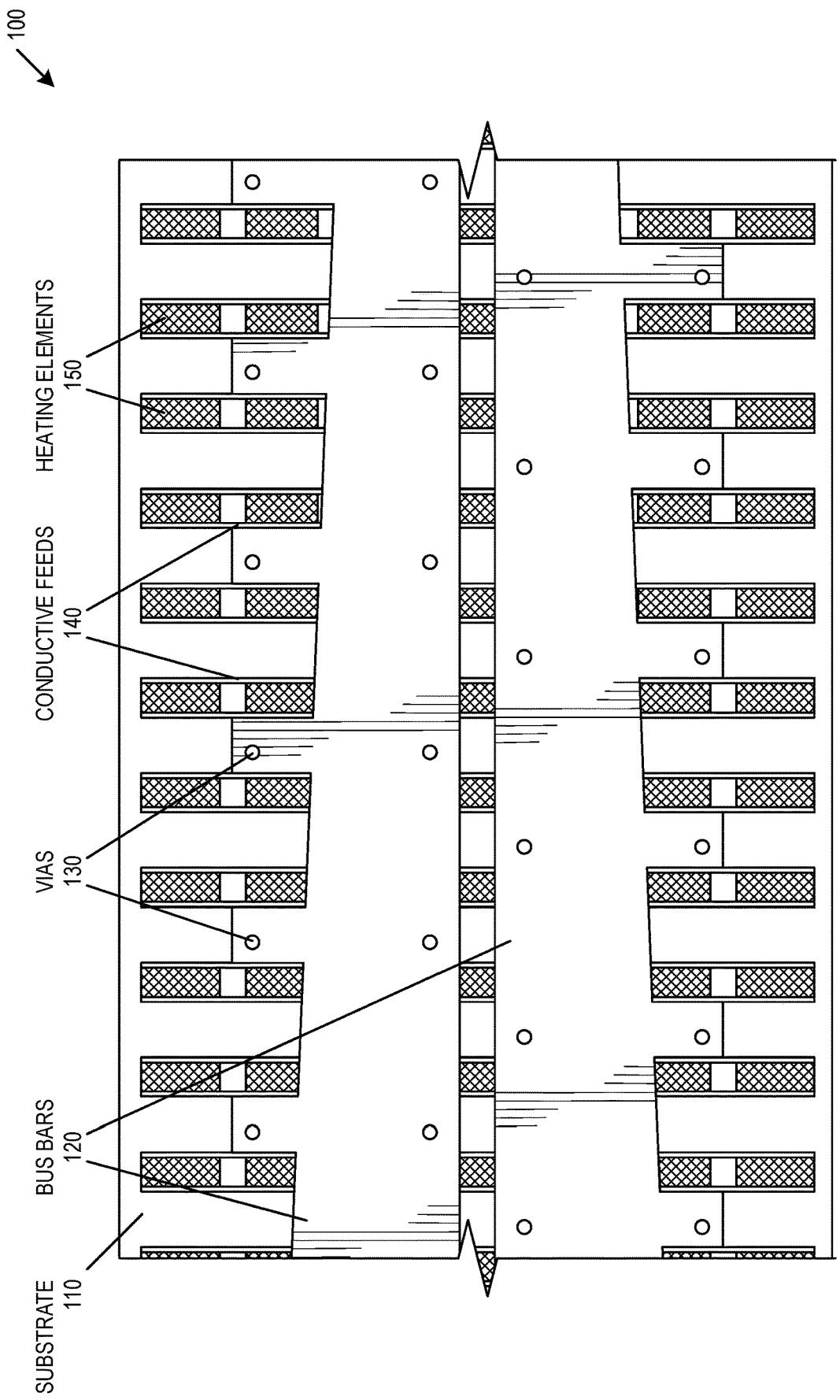
FIG. 1 is a diagram of a first side of a self-regulating flexible heating device, in accordance with at least one embodiment of the invention.

FIG. 1 is a diagram of a first side of a self-regulating flexible heating device 100, in accordance with at least one embodiment of the invention. Device 100 includes a flexible film substrate 110, where the flexible film substrate 110 may include a polyester film, a polyetherimide film, a polyimide film, or a similar flexible film. In the example shown in FIG. 1, the substrate 110 includes a translucent or transparent film, which enables viewing through the substrate 110 of the conductive feeds 140 and heating elements 150 that are printed on the second side of the substrate 110.

Device 100 may include two or more bus bars 120 printed on the first side of the substrate 110. In an example, the bus bars 120 may be printed using a conductive ink, such as a silver conductive ink. Various conductive ink printing techniques may be used, though screen printing of the conductive ink may provide an improved ability to control the volume and location of the printed ink. The bus bars 120 may be printed in pairs (e.g., anode and cathode) to provide a current loop in and out of the device 100. The bus bars 120 may be tapered from one end of the device 100 to the other end, such as to provide an approximately consistent total cross-sectional area (e.g., approximately constant resistance) for the heating elements 150. In the example shown in FIG. 1, the left side of bus bars 120 is closer to the power source, so it is designed to include a larger cross-sectional area (e.g., lower resistance) than the right side of the bus bars 120.

Each of the bus bars 120 may be conductively coupled to the other side of the substrate through a plurality of conductive vias 130. Each of the conductive vias 130 is formed by drilling holes (e.g. apertures) through the substrate and applying a vacuum to promote passage of the printed conductive ink through the holes. Drilling holes for vias 130 may provide the ability to form holes through multiple layers of substrate 110, however the holes may be formed using laser drilling or other methods. In an example, the substrate 110 may be placed on a vacuum surface, the conductive ink is printed on the upper surface of the substrate 110, and a vacuum applied by the vacuum surface to pull conductive ink through the holes. A porous fouling protection film may be disposed between the substrate 110 and the vacuum surface to retain excess conductive ink, thereby reducing or preventing fouling of the vacuum surface. This first application of conductive ink may be followed by a second application of conductive ink on the opposite side. In an example, following application of the first vacuum, the substrate may be flipped over, a second printing of conductive ink applied to the new upper surface, and a vacuum applied to pull conductive ink through the holes in the opposite direction. This secondary print and vacuum step may improve the conductivity and reliability of the conductive vias 130. Printing through vias 130 reduces the amount of conductive ink needed to carry sufficient current throughout the device, allowing for more heat to be generated with greater reliability. Using vias 130 reduces the overall resistance between the two surfaces of the substrate 110, therefore providing a more efficient and reliable connection between the two surfaces, especially when compared to connecting multiple PCB layers via external connectors, by using a layer folding technique, or by using additional dielectric layers to separate conductive traces. The number, location, and redundancy of multiple conductive vias 130 may be selected to increase reliability of individual heating areas against power loss due to loss of conductivity caused by physical wear and tear. The conductive vias 130 may be conductively coupled through conductive feeds 140 to a plurality of printed heating elements 150, such as shown in FIG. 2.

Figure 2:
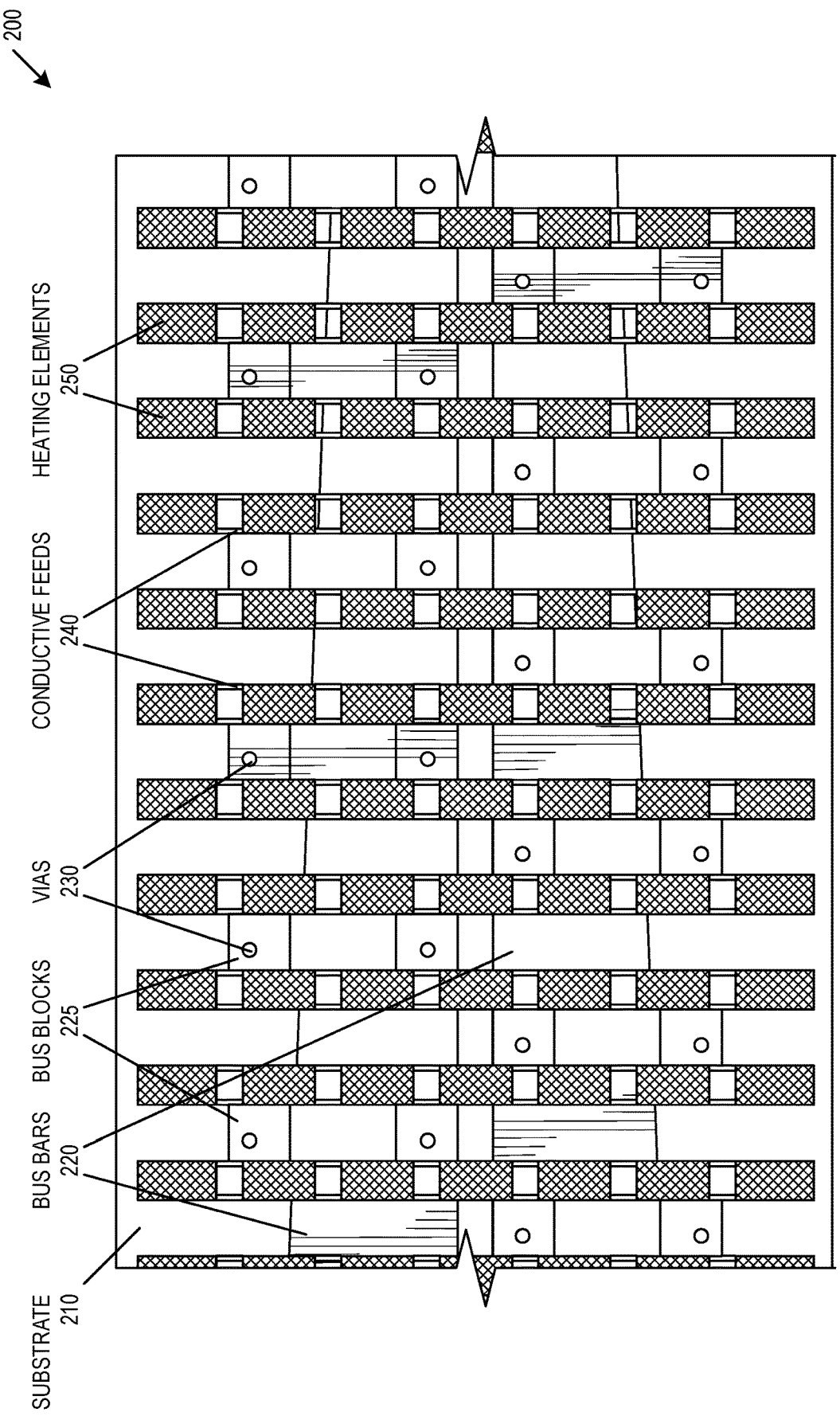
FIG. 2 is a diagram of a first side of a self-regulating flexible heating device, in accordance with at least one embodiment of the invention.

FIG. 2 is a diagram of a second side of a self-regulating flexible heating device 200, in accordance with at least one embodiment of the invention. In an example, the second side shown in FIG. 2 is opposite the first side shown in FIG. 1. As shown in FIG. 2, device 200 includes a flexible film substrate 210. Device 200 may include two or more bus bars 220, which may be printed on the first side of the substrate 210. Each of the bus bars 220 may be conductively coupled to the other side of the substrate through a plurality of conductive vias 230.

Following the first application (e.g., printing and application of vacuum) of conductive ink to the first side of the substrate 210, a second printing of conductive ink may be applied to the second side of the substrate 210, and a vacuum applied to pull conductive ink through the holes in the opposite direction. The second printing in conductive ink may include printing bus blocks 225 around each of the vias 230. The bus blocks 225 may be formed on the second side of the substrate 210, whereas the bus bars 220 may be formed on the first side of the substrate. In the example shown in FIG. 2, the substrate 210 includes a translucent or transparent film, which enables viewing through the substrate 210 of the bus bars 220 that are printed on the second side of the substrate 210. The size and geometry of the printed bus blocks 225 may be selected to provide sufficient ink to be drawn into the vias 230, and to conductively couple the bus bars 220 to the conductive feeds 240.

The conductive vias 130 may be conductively coupled through the bus blocks 225 and conductive feeds 240 to a plurality of printed heating elements 250. The conductive feeds 240 and heating elements 250 may be printed on the second side of the substrate 210. In an example, the bus blocks 225 and conductive feeds 240 may be formed using conductive ink disposed during the application of conductive ink on the second side of the substrate 210. The conductive feeds 240 may be printed in pairs to provide a current loop through each of the printed heating elements 250. The conductive feeds 240 may be conductively coupled to the printed heating elements 250 in parallel, which may reduce the current needed to supply the printed heating elements 250 and improve reliability.

The printed heating elements 250 may include printing using a positive temperature coefficient (PTC) ink. The PTC ink may be selected to provide self-regulation of the temperature and power consumption of the device 200. For example, a voltage applied to PTC ink causes the PTC ink to generate heat, and increased PTC ink temperature increases the electrical resistance of the PTC ink, which in turn reduces the amount of current that flows into the PTC ink. As the PTC ink approaches a certain maximum temperature, the resistance increases such that little or no additional current flows, and the PTC ink maintains the maximum temperature for as long as the voltage is applied. The type of PTC ink and configuration of heating elements 250 may be selected to provide a specific maximum temperature.

In addition to providing a specific maximum temperature, the configuration of the heating elements 250 (e.g., size, geometry, number of printed heating elements 250, type of PTC ink) may be selected to provide additional features. The configuration may be selected to provide controlled, multiple independent zone heating. For example, additional bus bars 120 may be used to provide power to one or more predetermined groupings of printed heating elements 250, such as a heating of an outer perimeter of heating elements 250. The configuration of the heating elements 250 may be selected to provide improved power consumption, such as to provide a lower voltage drop (e.g., reduced power loss) for non-rectangular devices 200.

In addition to providing a specific maximum temperature, the configuration of the heating elements 250 may be selected to provide a predetermined heating response profile. For example, heating elements 250 may be disposed on both sides of the substrate 210 and electrically coupled with bus bars 220. Because the heating elements 250 use PTC ink, the maximum temperature of each heating element 250 is limited primarily by the selected type of PTC ink, and not by the number of heating elements 250. The total heat generated by the flexible heating device may be determined by the selected type of PTC ink, and by the size and placement of the heating elements 250. In an example, a pair of heating elements 250 may be placed on opposite sides of the substrate 210, such that the pair of heating elements 250 are separated only by the substrate 210, and are mutually thermally coupled. Because heating elements 250 are mutually thermally coupled, they will rise to the desired temperature approximately twice as fast as a single heating element 250, but will generate approximately as much total heat output as a single heating element 250. Two or more heating elements 250 may be arranged so as to be thermally uncoupled, such as by placing them on different regions or by thermally coupling the heating elements 250 to other devices such as a heat sink or a nearby object to be heated.

Figure 3:
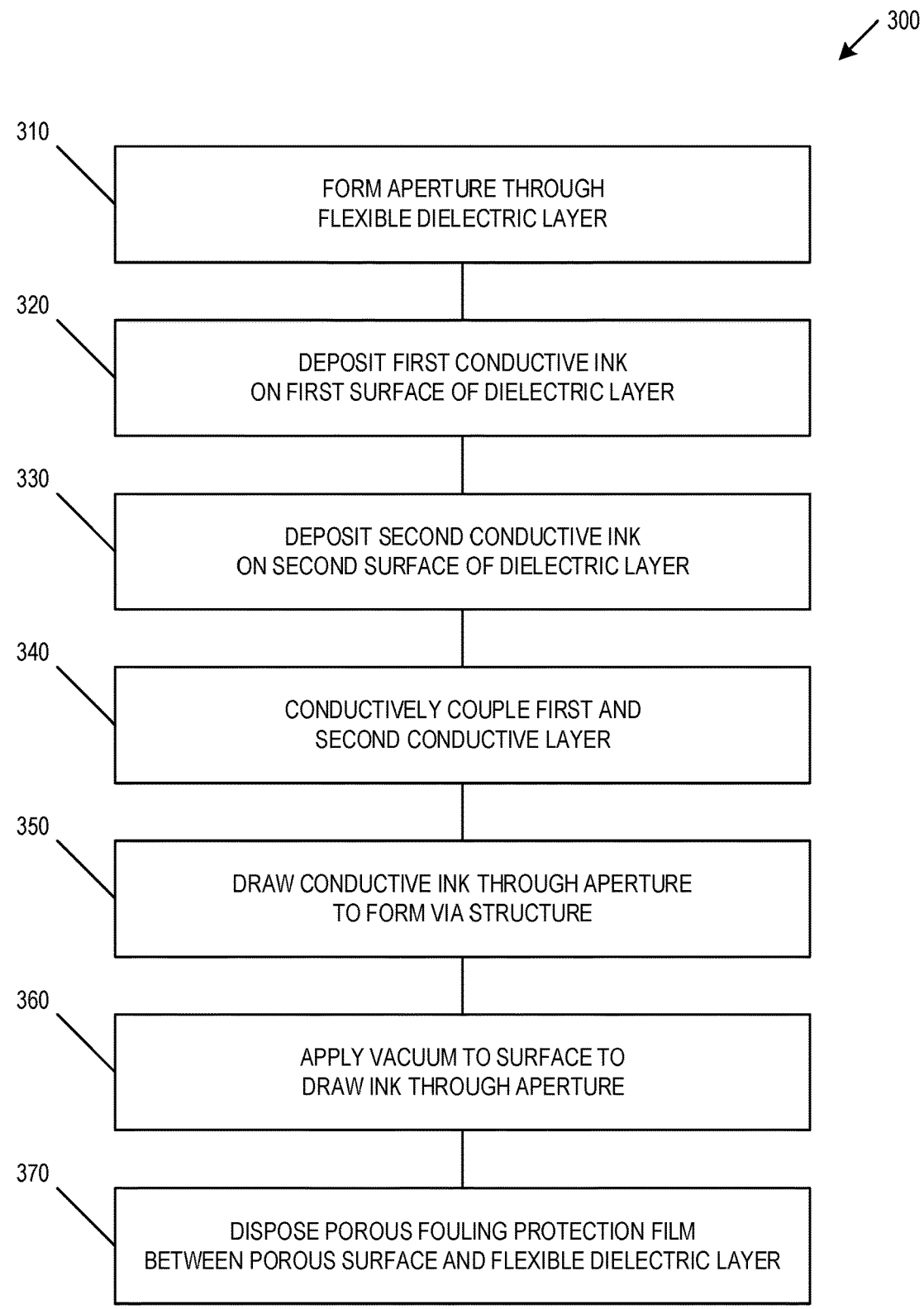
FIG. 3 is a block diagram illustrating a method for forming a self-regulating flexible heating device, in accordance with at least one embodiment of the invention.

FIG. 3 is a block diagram illustrating a method 300 for forming a self-regulating flexible heating device, in accordance with at least one embodiment of the invention.

Method 300 may include forming 310 at least one aperture through a flexible dielectric layer. Method 300 may include depositing 320 a first conductive ink on a first surface of the flexible dielectric layer to form a first conductive layer. Method 300 may include depositing 330 a second conductive ink on a second surface of the dielectric layer to form a second conductive layer.

The first and second conductive inks may include the same type of conductive ink. The first conductive ink may include silver, and the second conductive ink may include carbon. The depositing 320 of the first or second conductive ink may include printing a respective ink upon the flexible dielectric layer in a specified pattern. The specified pattern may establish a specified resistance that varies along at least one axis of a respective conductive layer. The printing may include a screen-printing technique. A carrier for the respective ink may be removed by heating at least one of the first conductive ink or the second conductive ink after deposition. At least a portion of the second conductive layer may define a heating element having a positive temperature coefficient. At least a portion of the second conductive layer may define respective heating elements. A pattern defined by at least one of the first or second conductive layers may be tapered to establish a specified thermal profile along the respective heating elements when energized. The specified thermal profile may define a substantially uniform thermal profile.

Method 300 may include conductively coupling 340 the first conductive layer and the second conductive layer through the aperture. This conductive coupling 340 may include drawing 350 at least one of the first or second conductive inks through the aperture to form a via structure. The drawing 350 of at least one of the first or second conductive inks may include applying 360 a vacuum to either the first or the second surface of the dielectric layer. The application 360 of the vacuum may include placing at least one of the first or the second surface of the dielectric layer on or nearby a porous surface and establishing a partial vacuum through the porous surface.

Method 300 may include disposing 370 a porous fouling protection film between the porous surface and the flexible dielectric layer. The porous fouling protection film may establishment of the partial vacuum through the porous fouling protection film while inhibiting passage of the first conductive ink or the second conductive ink through the porous fouling protection film.

Figure 4:
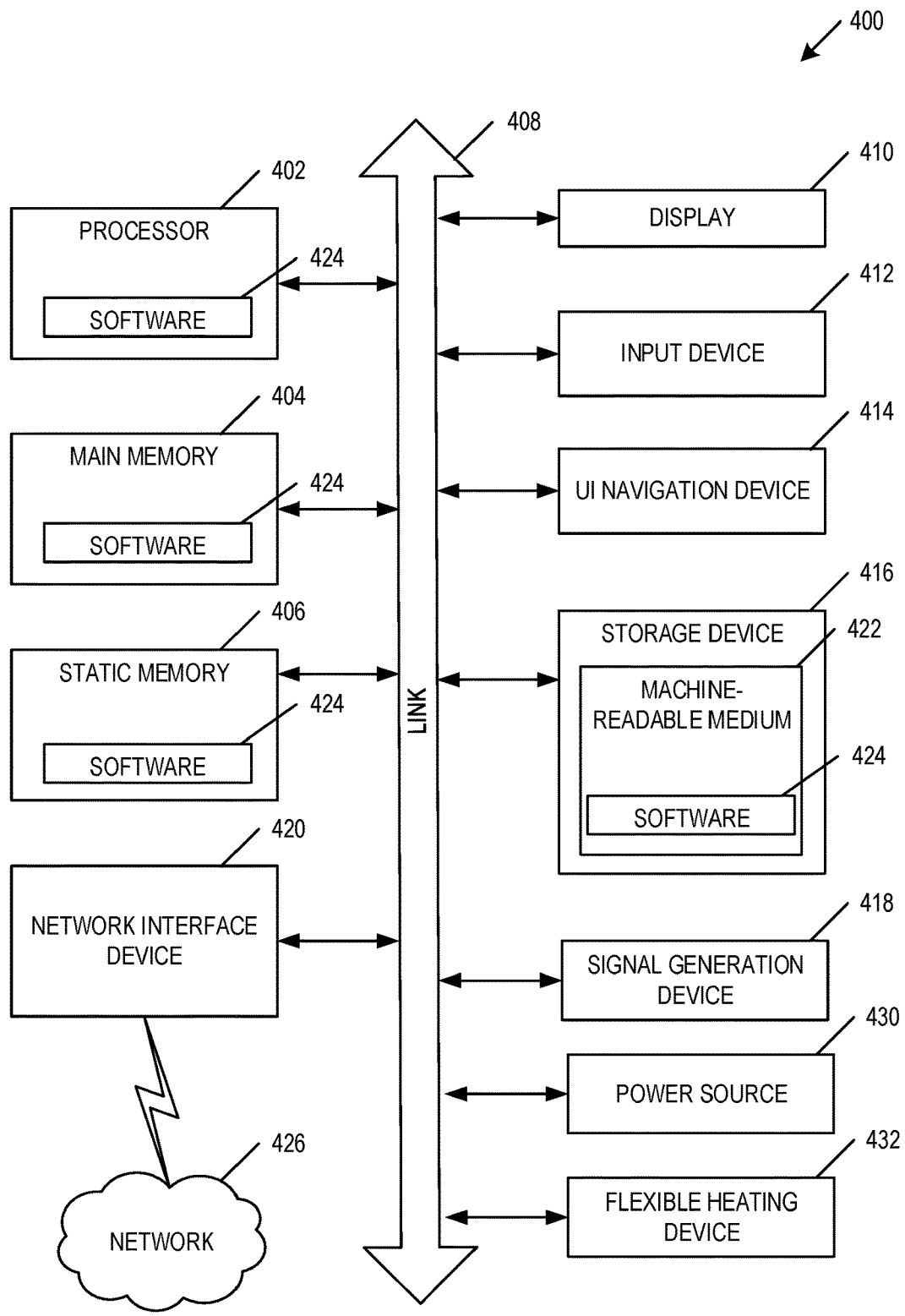
FIG. 4 is a block diagram illustrating a flexible heating device in the example form of an electronic device, according to an example embodiment.

FIG. 4 is a block diagram illustrating a flexible heating device in the example form of an electronic device 400, within which a set or sequence of instructions may be executed to cause the machine to perform any one of the methodologies discussed herein, including formation of a flexible heating device or the operation (e.g., heating) of a flexible heating device. Electronic device 400 may also represent the devices shown in FIGS. 1-2. In alternative embodiments, the electronic device 400 operates as a stand-alone device or may be connected (e.g., networked) to other machines. In a networked deployment, the electronic device 400 may operate in the capacity of either a server or a client machine in server-client network environments, or it may act as a peer machine in peer-to-peer (or distributed) network environments. The electronic device 400 may be an integrated circuit (IC), a portable electronic device, a personal computer (PC), a tablet PC, a hybrid tablet, a personal digital assistant (PDA), a mobile telephone, or any electronic device 400 capable of executing instructions (sequential or otherwise) that specify actions to be taken by that machine to detect a user input. Further, while only a single electronic device 400 is illustrated, the terms "machine" or "electronic device" shall also be taken to include any collection of machines or devices that individually or jointly execute a set (or multiple sets) of instructions to perform any one or more of the methodologies discussed herein, including formation of a flexible heating device or the operation of the flexible heating device. Similarly, the term "processor-based system" shall be taken to include any set of one or more machines that are controlled by or operated by a processor (e.g., a computer) to execute instructions, individually or jointly, to perform any one or more of the methodologies discussed herein, including formation of a flexible heating device or the operation of the flexible heating device.

Example electronic device 400 includes at least one processor 402 (e.g., a central processing unit (CPU), a graphics processing unit (GPU) or both, processor cores, compute nodes, etc.), a main memory 404 and a static memory 406, which communicate with each other via a link 408 (e.g., bus). The electronic device 400 may further include a display unit 410, where the display unit 410 may include a single component that provides a user-readable display and a protective layer, or another display type. The electronic device 400 may further include an input device 412, such as a pushbutton, a keyboard, or an NFC card reader. The electronic device 400 may additionally include a user interface (UI) navigation device 414 (e.g., a mouse or touch-sensitive input). In one embodiment, the display unit 410, input device 412 and UI navigation device 414 are incorporated into the device described herein. The electronic device 400 may additionally include a storage device 416, such as a drive unit. The electronic device 400 may additionally include a signal generation device 418, such as a speaker to provide an audible feedback, or one or more LEDs to provide a visual feedback. The electronic device 400 may additionally include a network interface device 420, and one or more additional sensors (not shown), such as a global positioning system (GPS) sensor, compass, accelerometer, or another sensor.

The storage device 416 includes a machine-readable medium 422 on which is stored one or more sets of data structures and instructions 424 (e.g., software) embodying or utilized by any one or more of the methodologies or functions described herein, including formation of a flexible heating device or the operation of the flexible heating device. The instructions 424 may also reside, completely or at least partially, within the main memory 404, static memory 406, and/or within the processor 402 during execution thereof by the electronic device 400. The main memory 404, static memory 406, and the processor 402 may also constitute machine-readable media.

While the machine-readable medium 422 is illustrated in an example embodiment to be a single medium, the term "machine-readable medium" may include a single medium or multiple media (e.g., a centralized or distributed database, and/or associated caches and servers) that store the one or more instructions 424. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 424 may further be transmitted or received over a communications network 426 using a transmission medium via the network interface device 420 utilizing any one of a number of well-known transfer protocols (e.g., HTTP). Examples of communication networks include a local area network (LAN), a wide area network (WAN), the Internet, mobile telephone networks, and wireless data networks (e.g., Wi-Fi, NFC, Bluetooth, Bluetooth LE, 3G, 4G LTE/LTE-A, WiMAX networks, etc.). The term "transmission medium" shall be taken to include any intangible medium that is capable of storing, encoding, or carrying instructions for execution by the machine, and includes digital or analog communications signals or other intangible medium to facilitate communication of such software.

The electronic device 400 may additionally include a power source 430 and at least one flexible heating device 432. Power source 430 may be embedded within or attached to the flexible heating device 432, or power source 430 may be removable. A removable power source 430 also provides the ability to use the flexible heating device 432 without requiring a constant connection to the power source 430. A removable power source 430 may be used in combination with a temporary power storage device. For example, a power source 430 may provide power to a flexible temporary storage device such as a lightweight and flexible capacitor, where the flexible capacitor may provide a desired voltage to the flexible heating device 432. The power source 430 may be used to store a generated voltage. For example, an external voltage may be applied to the power source 430 for temporary storage. The stored power may subsequently be applied from the power source 430 to the flexible heating device 432.

To better illustrate the method and apparatuses disclosed herein, a non-limiting list of embodiments is provided here.

Example 1 is a method of forming a flexible heating device, the method comprising: forming at least one aperture through a flexible dielectric layer; depositing a first conductive ink on a first surface of the flexible dielectric layer to form a first conductive layer; depositing a second conductive ink on a second surface of the dielectric layer to form a second conductive layer; and conductively coupling the first conductive layer and the second conductive layer through the aperture by drawing at least one of the first or second conductive inks through the aperture to form a via structure.

In Example 2, the subject matter of Example 1 optionally includes depositing a second application of the first conductive ink on the second surface of the dielectric layer over the aperture, wherein the second application of the first conductive ink conductively couples the first conductive ink on the first surface to the second conductive ink on the second surface.

In Example 3, the subject matter of any one or more of Examples 1-2 optionally include wherein drawing at least one of the first or second conductive inks through the aperture includes applying a vacuum to either the first or the second surface of the dielectric layer.

In Example 4, the subject matter of Example 3 optionally includes wherein applying the vacuum includes placing at least one of the first or the second surface of the dielectric layer on or nearby a porous surface and establishing a partial vacuum through the porous surface.

In Example 5, the subject matter of Example 4 optionally includes disposing a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

In Example 6, the subject matter of any one or more of Examples 1-5 optionally include wherein the first and second conductive inks include the same type of conductive ink.

In Example 7, the subject matter of any one or more of Examples 1-6 optionally include wherein the first conductive ink includes silver and wherein the second conductive ink includes carbon.

In Example 8, the subject matter of any one or more of Examples 1-7 optionally include wherein at least one of the depositing the first conductive ink or the second conductive ink includes printing a respective ink upon the flexible dielectric layer in a specified pattern.

In Example 9, the subject matter of Example 8 optionally includes wherein the specified pattern establishes a specified resistance that varies along at least one axis of a respective conductive layer.

In Example 10, the subject matter of any one or more of Examples 8-9 optionally include wherein the printing includes a screen printing technique.

Example 11 is one or more machine-readable medium including instructions, which when executed by a computing system, cause the computing system to perform any of the methods of Examples 1-7.

Example 12 is an apparatus comprising means for performing any of the methods of Examples 1-7.

In Example 13, the subject matter of any one or more of Examples 8-12 optionally include wherein a carrier for the respective ink is removed by heating at least one of the first conductive ink or the second conductive ink after deposition.

In Example 14, the subject matter of any one or more of Examples 1-13 optionally include wherein at least a portion of the second conductive layer defines a heating element having a positive temperature coefficient.

In Example 15, the subject matter of any one or more of Examples 1-14 optionally include wherein at least a portion of the second conductive layer defines respective heating elements; and wherein a pattern defined by at least one of the first or second conductive layers is tapered to establish a specified thermal profile along the respective heating elements when energized.

In Example 16, the subject matter of Example 15 optionally includes wherein the specified thermal profile defines a substantially uniform thermal profile.

Example 17 is a flexible heating device, the device comprising: a flexible dielectric layer including at least one aperture; a first conductive layer formed using a first conductive ink disposed on a first surface of the flexible dielectric layer; a second conductive layer formed using depositing a second conductive ink disposed on a second surface of the dielectric layer; and a via structure formed through the at least one aperture to couple the first conductive layer with the second conductive layer, the via structure including at least one of the first or second conductive inks drawn through the at least one aperture.

In Example 18, the subject matter of Example 17 optionally includes a second application of the first conductive ink disposed on the second surface of the dielectric layer over the aperture, wherein the second application of the first conductive ink conductively couples the first conductive ink on the first surface to the second conductive ink on the second surface.

In Example 19, the subject matter of any one or more of Examples 17-18 optionally include wherein the via structure is formed by applying a vacuum to draw either the first or the second surface of the dielectric layer through the at least one aperture.

In Example 20, the subject matter of Example 19 optionally includes wherein the via structure is formed by placing at least one of the first or the second surface of the dielectric layer on or nearby a porous surface and establishing a partial vacuum through the porous surface.

In Example 21, the subject matter of Example 20 optionally includes wherein the via structure is formed by disposing a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

In Example 22, the subject matter of any one or more of Examples 17-21 optionally include wherein the first and second conductive inks include the same type of conductive ink.

In Example 23, the subject matter of any one or more of Examples 17-22 optionally include wherein the first conductive ink includes silver and wherein the second conductive ink includes carbon.

In Example 24, the subject matter of any one or more of Examples 17-23 optionally include wherein at least one of the depositing the first conductive ink or the second conductive ink includes printing a respective ink upon the flexible dielectric layer in a specified pattern.

In Example 25, the subject matter of Example 24 optionally includes wherein the specified pattern establishes a specified resistance that varies along at least one axis of a respective conductive layer.

In Example 26, the subject matter of any one or more of Examples 24-25 optionally include wherein the printing includes a screen printing technique.

In Example 27, the subject matter of any one or more of Examples 24-26 optionally include wherein a carrier for the respective ink is removed by heating at least one of the first conductive ink or the second conductive ink after deposition.

In Example 28, the subject matter of any one or more of Examples 17-27 optionally include wherein at least a portion of the second conductive layer defines a heating element having a positive temperature coefficient.

In Example 29, the subject matter of any one or more of Examples 17-28 optionally include wherein at least a portion of the second conductive layer defines respective heating elements; and wherein a pattern defined by at least one of the first or second conductive layers is tapered to establish a specified thermal profile along the respective heating elements when energized.

In Example 30, the subject matter of Example 29 optionally includes wherein the specified thermal profile defines a substantially uniform thermal profile.

Example 31 is at least one non-transitory machine-readable storage medium, comprising a plurality of instructions that, responsive to being executed with processor circuitry of a computer-controlled device, cause the computer-controlled device to perform operations comprising: form at least one aperture through a flexible dielectric layer; deposit a first conductive ink on a first surface of the flexible dielectric layer to form a first conductive layer; deposit a second conductive ink on a second surface of the dielectric layer to form a second conductive layer; and conductively couple the first conductive layer and the second conductive layer through the aperture by drawing at least one of the first or second conductive inks through the aperture to form a via structure.

In Example 32, the subject matter of Example 31 optionally includes the instructions further causing the computer-controlled device to deposit a second application of the first conductive ink on the second surface of the dielectric layer over the aperture, wherein the second application of the first conductive ink conductively couples the first conductive ink on the first surface to the second conductive ink on the second surface.

In Example 33, the subject matter of any one or more of Examples 31-32 optionally include wherein the instructions causing the computer-controlled device to draw at least one of the first or second conductive inks through the aperture includes instructions causing the computer-controlled device to apply a vacuum to either the first or the second surface of the dielectric layer.

In Example 34, the subject matter of Example 33 optionally includes wherein the application of the vacuum includes placing at least one of the first or the second surface of the dielectric layer on or nearby a porous surface and establishing a partial vacuum through the porous surface.

In Example 35, the subject matter of Example 34 optionally includes the instructions further causing the computer-controlled device to dispose a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

In Example 36, the subject matter of any one or more of Examples 31-35 optionally include wherein the first and second conductive inks include the same type of conductive ink.

In Example 37, the subject matter of any one or more of Examples 31-36 optionally include wherein the first conductive ink includes silver and wherein the second conductive ink includes carbon.

In Example 38, the subject matter of any one or more of Examples 31-37 optionally include wherein at least one of the depositing the first conductive ink or the second conductive ink includes instructions causing the computer-controlled device to print a respective ink upon the flexible dielectric layer in a specified pattern.

In Example 39, the subject matter of Example 38 optionally includes wherein the specified pattern establishes a specified resistance that varies along at least one axis of a respective conductive layer.

In Example 40, the subject matter of any one or more of Examples 38-39 optionally include wherein the printing includes a screen printing technique.

In Example 41, the subject matter of any one or more of Examples 38-40 optionally include wherein a carrier for the respective ink is removed by heating at least one of the first conductive ink or the second conductive ink after deposition.

In Example 42, the subject matter of any one or more of Examples 31-41 optionally include wherein at least a portion of the second conductive layer defines a heating element having a positive temperature coefficient.

In Example 43, the subject matter of any one or more of Examples 31-42 optionally include wherein at least a portion of the second conductive layer defines respective heating elements; and wherein a pattern defined by at least one of the first or second conductive layers is tapered to establish a specified thermal profile along the respective heating elements when energized.

In Example 44, the subject matter of Example 43 optionally includes wherein the specified thermal profile defines a substantially uniform thermal profile.

Example 45 is a flexible heating apparatus, the apparatus comprising: means for forming at least one aperture through a flexible dielectric layer; means for depositing a first conductive ink on a first surface of the flexible dielectric layer to form a first conductive layer; means for depositing a second conductive ink on a second surface of the dielectric layer to form a second conductive layer; and means for conductively coupling the first conductive layer and the second conductive layer through the aperture by drawing at least one of the first or second conductive inks through the aperture to form a via structure.

In Example 46, the subject matter of Example 45 optionally includes means for depositing a second application of the first conductive ink on the second surface of the dielectric layer over the aperture, wherein the second application of the first conductive ink conductively couples the first conductive ink on the first surface to the second conductive ink on the second surface.

In Example 47, the subject matter of any one or more of Examples 45-46 optionally include wherein drawing at least one of the first or second conductive inks through the aperture includes applying a vacuum to either the first or the second surface of the dielectric layer.

In Example 48, the subject matter of Example 47 optionally includes wherein applying the vacuum includes placing at least one of the first or the second surface of the dielectric layer on or nearby a porous surface and establishing a partial vacuum through the porous surface.

In Example 49, the subject matter of Example 48 optionally includes means for disposing a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

In Example 50, the subject matter of any one or more of Examples 45-49 optionally include wherein the first and second conductive inks include the same type of conductive ink.

In Example 51, the subject matter of any one or more of Examples 45-50 optionally include wherein the first conductive ink includes silver and wherein the second conductive ink includes carbon.

In Example 52, the subject matter of any one or more of Examples 45-51 optionally include wherein at least one of the depositing the first conductive ink or the second conductive ink includes printing a respective ink upon the flexible dielectric layer in a specified pattern.

In Example 53, the subject matter of Example 52 optionally includes wherein the specified pattern establishes a specified resistance that varies along at least one axis of a respective conductive layer.

In Example 54, the subject matter of any one or more of Examples 52-53 optionally include wherein the printing includes a screen printing technique.

In Example 55, the subject matter of any one or more of Examples 52-54 optionally include wherein a carrier for the respective ink is removed by heating at least one of the first conductive ink or the second conductive ink after deposition.

In Example 56, the subject matter of any one or more of Examples 45-55 optionally include wherein at least a portion of the second conductive layer defines a heating element having a positive temperature coefficient.

In Example 57, the subject matter of any one or more of Examples 45-56 optionally include wherein at least a portion of the second conductive layer defines respective heating elements; and wherein a pattern defined by at least one of the first or second conductive layers is tapered to establish a specified thermal profile along the respective heating elements when energized.

In Example 58, the subject matter of Example 57 optionally includes wherein the specified thermal profile defines a substantially uniform thermal profile.

Example 59 is one or more non-transitory machine-readable medium including instructions, which when executed by a machine, cause the machine to perform operations of any of the operations of Examples 1-58.

Example 60 is an apparatus comprising means for performing any of the operations of Examples 1-58.

Example 61 is a system to perform the operations of any of the Examples 1-58.

Example 62 is a method to perform the operations of any of the Examples 1-58.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37

C.F.R. § 1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of forming a flexible heating device, the method comprising:
    forming at least one aperture through a flexible dielectric layer;
    depositing a first conductive ink on a first surface of the flexible dielectric layer to form a first conductive layer, the first conductive layer including a positive bus bar and a negative bus bar;
    applying a first vacuum to draw the first conductive ink into the aperture to mechanically couple the first conductive ink to an interior aperture wall;
    depositing a second conductive ink on a second surface of the dielectric layer to form a second conductive layer;
    conductively coupling the first conductive layer and the second conductive layer through the aperture by applying a second vacuum to draw the second conductive ink through the aperture to mechanically and conductively couple the second conductive ink to the first conductive ink on the interior aperture wall to form a conductive via structure;
    depositing a plurality of printed heating elements on the second surface of the dielectric layer; and
    conductively coupling the plurality of printed heating elements through the second conductive layer to the positive bus bar and to the negative bus bar.

2. The method of claim 1, further including depositing a second application of the first conductive ink on the second surface of the dielectric layer over the aperture, wherein the second application of the first conductive ink conductively couples the first conductive ink on the first surface to the second conductive ink on the second surface.

3. The method of claim 1, wherein drawing at least one of the first or second conductive inks through the aperture includes applying a vacuum to either the first or the second surface of the dielectric layer.

4. The method of claim 3, wherein applying the vacuum includes placing at least one of the first or the second surface of the dielectric layer on or nearby a porous surface and establishing a partial vacuum through the porous surface.

5. The method of claim 4, further including disposing a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

6. The method of claim 1, wherein the first and second conductive inks include the same type of conductive ink.

7. The method of claim 1, wherein the first conductive ink includes silver and wherein the second conductive ink includes carbon.

8. The method of claim 1, wherein at least one of the depositing the first conductive ink or the second conductive ink includes printing a respective ink upon the flexible dielectric layer in a specified pattern.

9. The method of claim 8, wherein the specified pattern establishes a specified resistance that varies along at least one axis of a respective conductive layer.

10. The method of claim 8, wherein a carrier for the respective ink is removed by heating at least one of the first conductive ink or the second conductive ink after deposition.

11. The method of claim 1, wherein the plurality of printed heating elements have a positive temperature coefficient.

12. The method of claim 1, wherein a pattern defined by at least one of the first or second conductive layers is tapered to establish a specified thermal profile along the respective plurality of printed heating elements when energized.

13. The method of claim 12, wherein the specified thermal profile defines a substantially uniform thermal profile.

14. A flexible heating device, the device comprising:
    a flexible dielectric layer including at least one aperture;
    a first conductive layer formed using a first conductive ink disposed on a first surface of the flexible dielectric layer, the first conductive layer forming a positive bus bar and a negative bus bar;
    a first via layer mechanically coupled to an interior aperture wall by applying a first vacuum to draw the first conductive ink into the aperture;
    a second conductive layer formed using depositing a second conductive ink disposed on a second surface of the dielectric layer;
    a second via layer mechanically and conductively coupled to the first via layer by applying a second vacuum to draw the second conductive ink into the aperture and onto the first via layer to form a hollow via structure through the aperture, the hollow via structure to couple the first conductive layer with the second conductive layer; and
    a plurality of printed heating elements conductively coupled through the second conductive layer to the positive bus bar and to the negative bus bar.

15. The system of claim 14, further including a second application of the first conductive ink disposed on the second surface of the dielectric layer over the aperture, wherein the second application of the first conductive ink conductively couples the first conductive ink on the first surface to the second conductive ink on the second surface.

16. The device of claim 14, wherein the via structure is formed by applying a vacuum to draw either the first or the second surface of the dielectric layer through the at least one aperture.

17. The device of claim 16, wherein the via structure is formed by placing at least one of the first or the second surface of the dielectric layer on or nearby a porous surface and establishing a partial vacuum through the porous surface.

18. The device of claim 17, wherein the via structure is formed by disposing a porous fouling protection film between the porous surface and the flexible dielectric layer, the porous fouling protection film permitting establishment of the partial vacuum through the porous fouling protection film while inhibiting passage of the first conductive ink or the second conductive ink through the porous fouling protection film.

19. At least one non-transitory machine-readable storage medium, comprising a plurality of instructions that, responsive to being executed with processor circuitry of a computer-controlled device, cause the computer-controlled device to perform operations comprising:

form at least one aperture through a flexible dielectric layer;

deposit a first conductive ink on a first surface of the flexible dielectric layer to form a first conductive layer, the first conductive layer including a positive bus bar and a negative bus bar;

apply a first vacuum to draw the first conductive ink into the aperture to mechanically couple the first conductive ink to an interior aperture wall;

deposit a second conductive ink on a second surface of the dielectric layer to form a second conductive layer;

conductively couple the first conductive layer and the second conductive layer through the aperture by applying a second vacuum to draw the second conductive ink through the aperture to mechanically and conductively couple the second conductive ink to the first conductive ink on the interior aperture wall to form a conductive via structure;

deposit a plurality of printed heating elements on the second surface of the dielectric layer; and conductively couple the plurality of printed heating elements through the second conductive layer to the positive bus bar and to the negative bus bar.

20. The non-transitory machine-readable storage medium of claim 19, the instructions further causing the computer-controlled device to deposit a second application of the first conductive ink on the second surface of the dielectric layer over the aperture, wherein the second application of the first conductive ink conductively couples the first conductive ink on the first surface to the second conductive ink on the second surface.

* * * * *